United States Patent
Chakravarthi et al.

(10) Patent No.: US 7,786,518 B2
(45) Date of Patent: Aug. 31, 2010

(54) GROWTH OF UNFACETED SIGE IN MOS TRANSISTOR FABRICATION

(75) Inventors: Srinivasan Chakravarthi, Murphy, TX (US); Periannan Chidambaram, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/212,346

(22) Filed: Sep. 17, 2008

(65) Prior Publication Data
US 2009/0166755 A1    Jul. 2, 2009

Related U.S. Application Data

(60) Provisional application No. 61/016,925, filed on Dec. 27, 2007.

(51) Int. Cl.
*H01L 21/336* (2006.01)
(52) U.S. Cl. .................. 257/288; 257/327; 257/338; 257/E21.634; 438/197; 438/300
(58) Field of Classification Search .............. None
See application file for complete search history.

(56) References Cited

U.S. PATENT DOCUMENTS 5,946,563 A * 8/1999 Uehara et al. ............. 438/183
6,870,230 B2 * 3/2005 Matsuda et al. ........... 257/365
7,176,522 B2 * 2/2007 Cheng et al. .............. 257/338
7,402,496 B2 * 7/2008 Liu et al. .................. 438/300
7,473,623 B2 * 1/2009 Chen et al. ................ 438/585
2002/0145156 A1 * 10/2002 Igarashi et al. ........... 257/262
2004/0219756 A1 * 11/2004 Cho et al. ................. 438/301
2005/0139872 A1 * 6/2005 Chidambaram et al. .... 257/288
2006/0163665 A1 * 7/2006 Chuang et al. ............ 257/374
2007/0057324 A1 * 3/2007 Tews et al. ............... 257/347
2007/0252230 A1 * 11/2007 Zhu et al. ................. 257/499
2008/0142840 A1 * 6/2008 Lindert et al. ............ 257/190
2009/0039442 A1 * 2/2009 Han et al. ................. 257/384

* cited by examiner

*Primary Examiner*—Evan Pert
*Assistant Examiner*—Andres Munoz
(74) *Attorney, Agent, or Firm*—Warren L. Franz; Wade J. Brady, III; Frederick J. Telecky, Jr.

(57) ABSTRACT

Semiconductor devices and fabrication methods are provided in which disposable gates are formed over isolation regions. Sidewall structures, including disposable sidewall structures, are formed on sidewalls of the disposable gates. An epitaxially grown silicon germanium is formed in recesses defined by the sidewalls. The process provides a compressive strained channel in the device without faceting of the epitaxially grown silicon germanium.

19 Claims, 10 Drawing Sheets

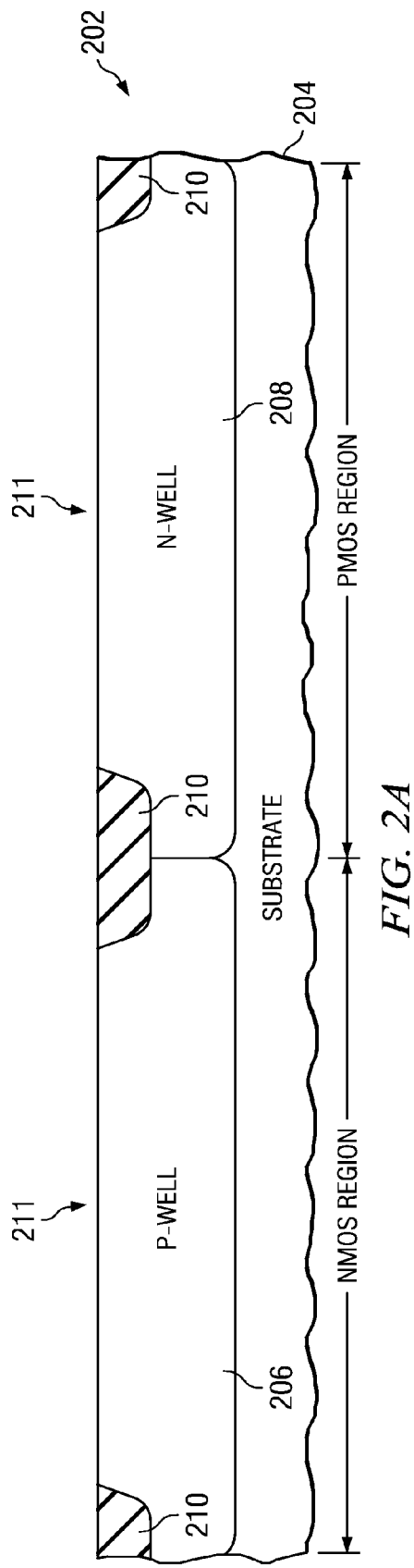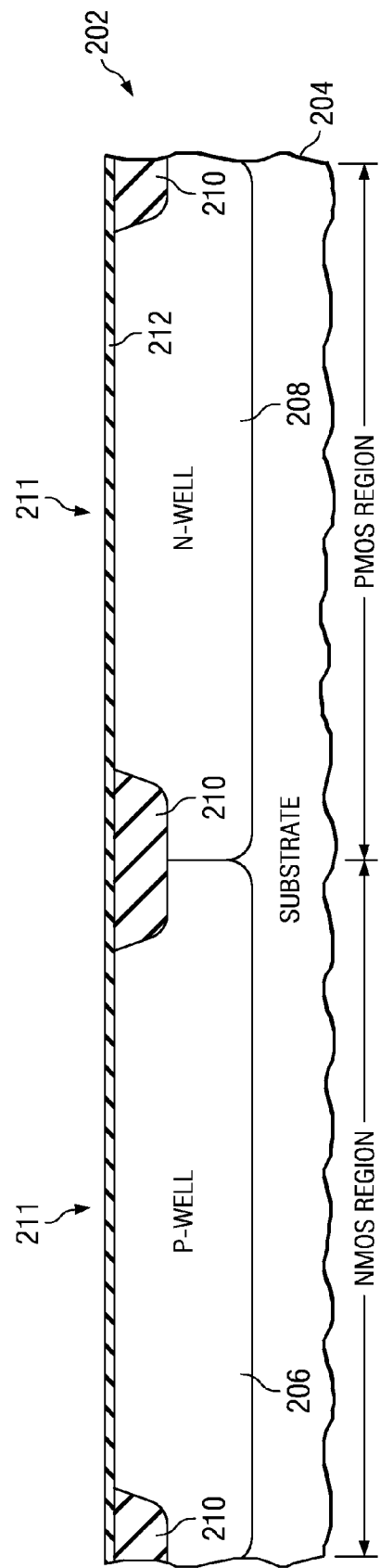
FIG. 2A
FIG. 2B

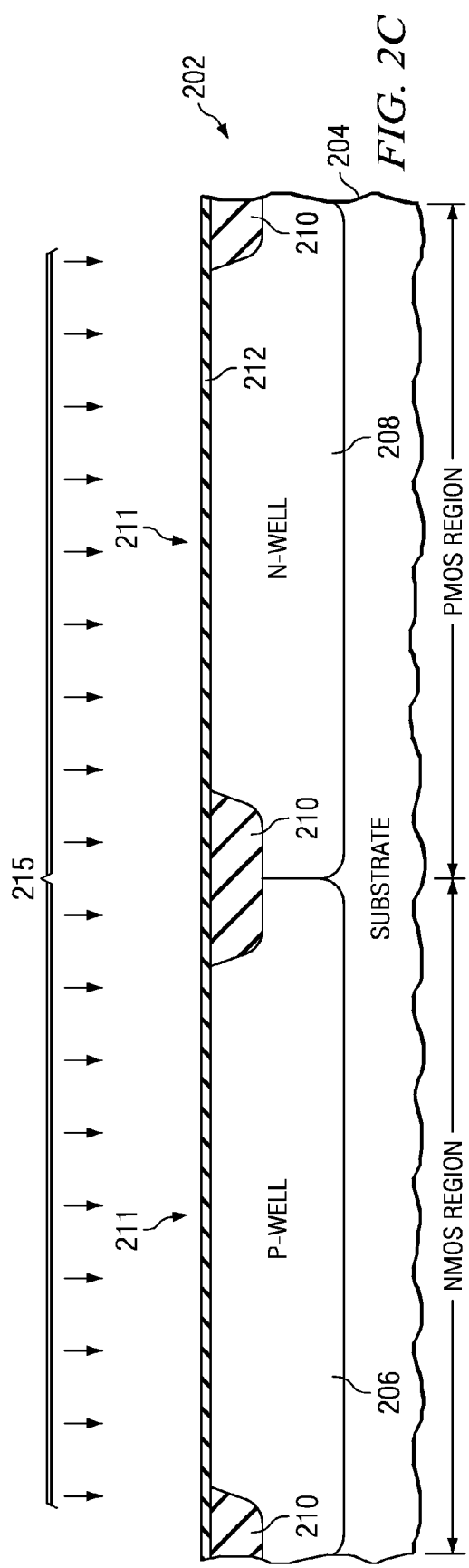
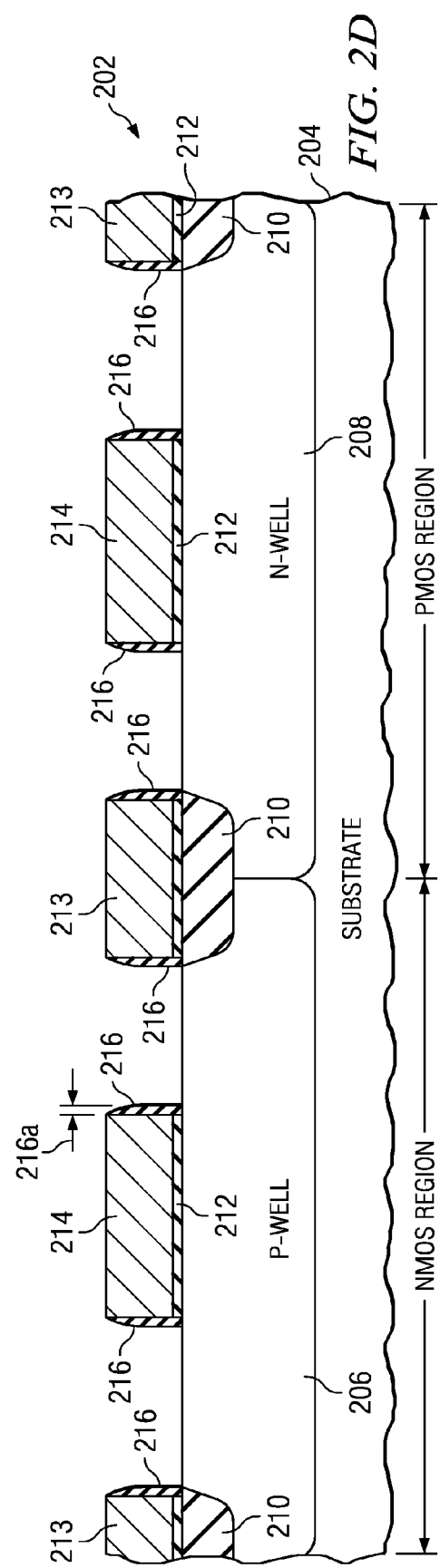

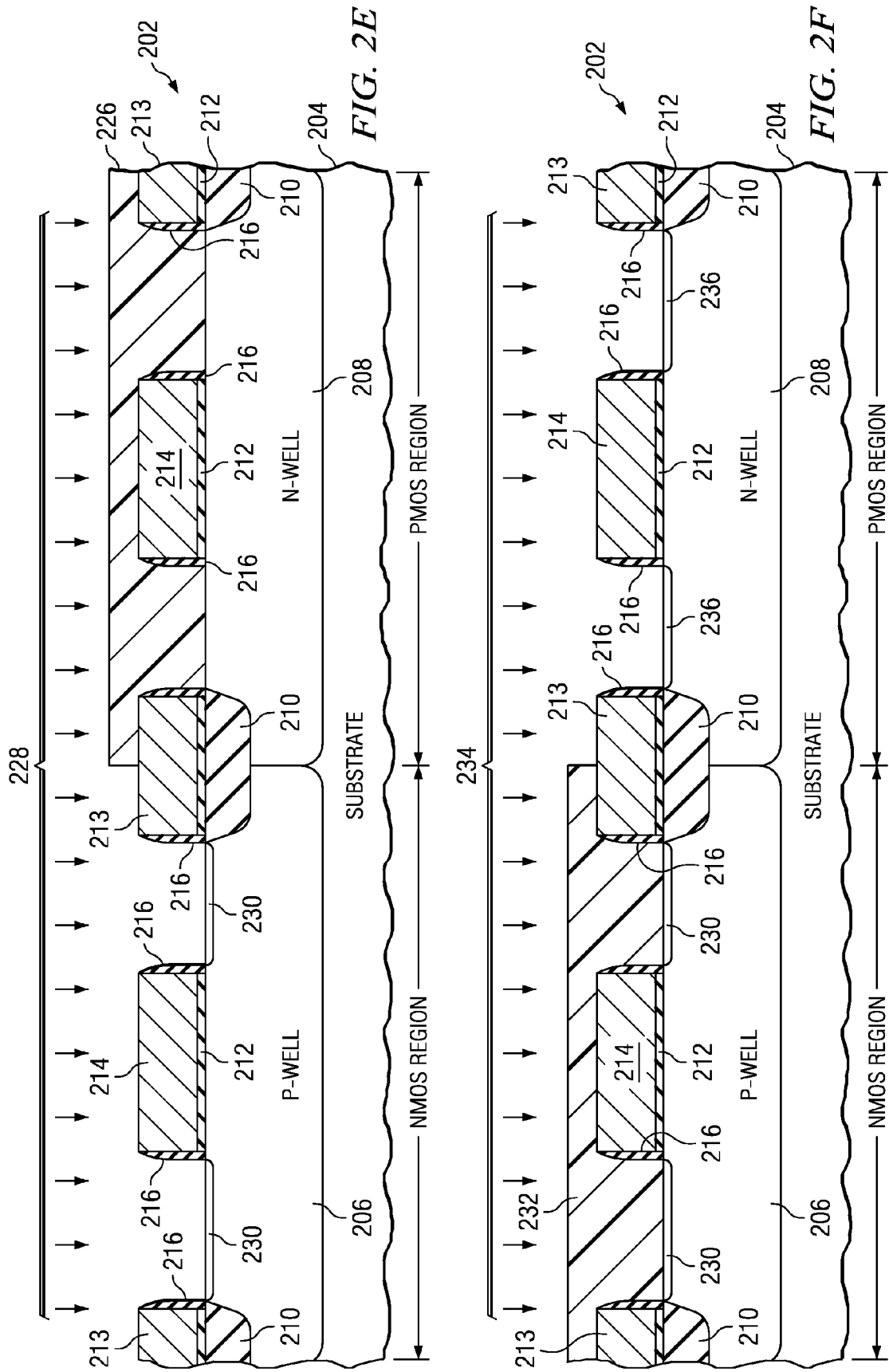

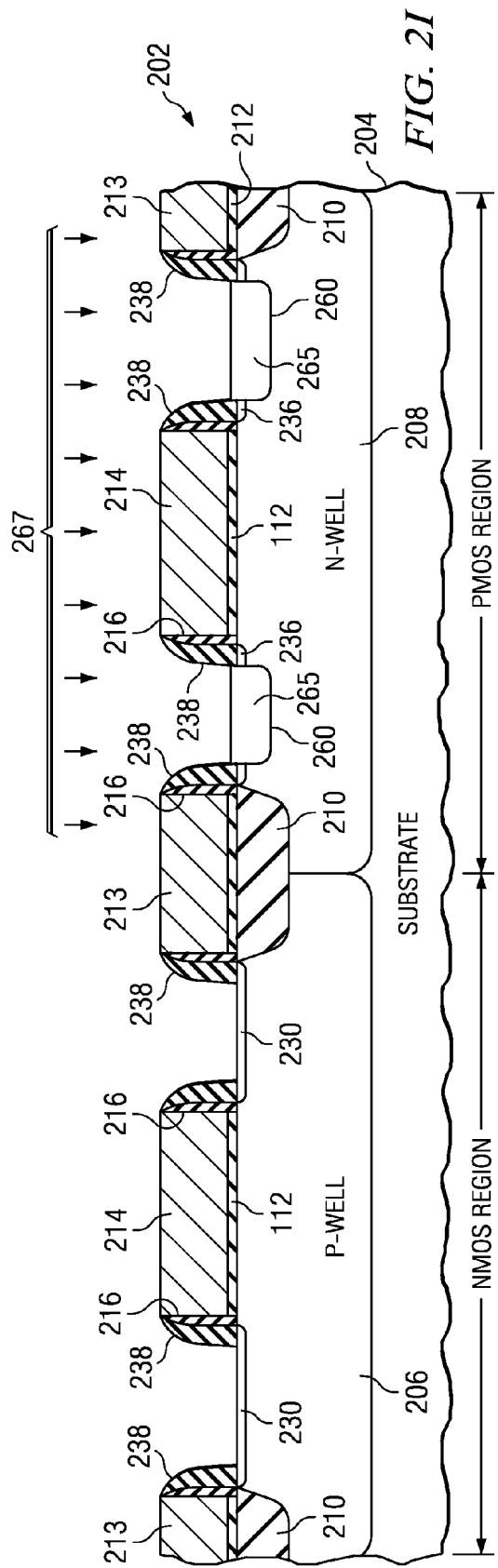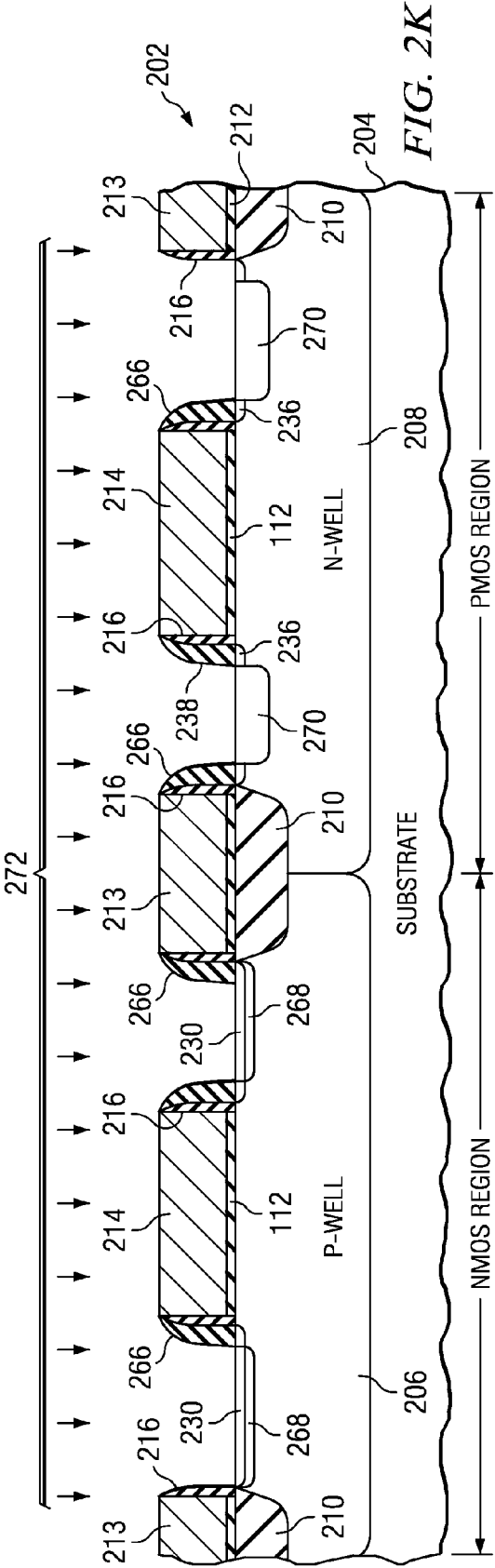

GROWTH OF UNFACETED SIGE IN MOS TRANSISTOR FABRICATION

This application claims priority to Ser. No. 61/016,925 filed Dec. 27, 2007, entitled "Growth of Unfaceted SiGe Along a Semiconductor Device Width."

FIELD OF THE INVENTION

The invention relates generally to semiconductor devices and associated methods of manufacture.

BACKGROUND

A conventional MOS transistor generally includes a semiconductor substrate, such as silicon, having a source, a drain, and a channel positioned between the source and drain. A gate stack composed of a conductive material (a gate conductor), an oxide layer (a gate oxide), and sidewall spacers is typically located above the channel. The gate oxide is typically located directly above the channel, while the gate conductor, generally comprised of polycrystalline silicon (polysilicon) material, is located above the gate oxide. The sidewall spacers protect the sidewalls of the gate conductor.

Generally, for a given electric field across the channel of a MOS transistor, the amount of current that flows through the channel is directly proportional to a mobility of carriers in the channel. Thus, the higher the mobility of the carriers in the channel, the more current can flow and the faster a circuit can perform when using high mobility MOS transistors. One way to increase the mobility of the carriers in the channel of a MOS transistor is to produce a mechanical stress in the channel.

A compressive strained channel has significant hole mobility enhancement over conventional devices. A tensile strained channel, such as a thin silicon channel layer grown on relaxed silicon-germanium, achieves significant electron mobility enhancement. The most common method of introducing tensile strain in a silicon channel region is to epitaxially grow the silicon channel layer on a relaxed silicon-germanium (SiGe) layer or substrate. The ability to form a relaxed SiGe layer is important in obtaining an overlying, epitaxially grown, silicon layer under biaxial tensile strain; however the attainment of the relaxed SiGe layer can be costly and difficult to achieve.

Another prior art method of obtaining a compressive strain in the channel is to epitaxially grow a SiGe layer over the entire active area. However, processes using selective epitaxial deposition for the engineering of elevated source/drain regions often result in overgrowth of the SiGe layer, typically on the order of 300 to 400 Angstroms. Such overgrowth on free surfaces results in faceting of edges due to minimization of interfacial energy causing strain relaxation along corners and potential strain in the channel. Similar to free surfaces, faceting also occurs in the presence of an oxide. Thus, SiGe along the edge of a shallow trench isolation (STI) is faceted, resulting in decreased strain in narrow devices.

It would be advantageous to have a semiconductor device and method that effectively and reliably provides strain to the device without the problems associated with faceting.

SUMMARY

In one embodiment, the invention is directed to a method of forming a semiconductor device comprising forming gates over a substrate, the gates including dummy gates overlying isolation regions; forming sidewall structures on sidewalls of the gates, including dummy sidewall structures on sidewalls of dummy gates; forming recesses in areas defined by sidewall structures; and filling with an epitaxially grown semiconductor material; forming a source region and a drain region by doping a first portion and a second portion of active regions adjacent a gate; and activating the dopants in the source region and the drain region by heating the active regions.

In another embodiment, the invention is directed to a semiconductor device comprising a gate structure over a substrate; a source and a drain adjacent the gate structure; one or more dummy structures formed over a shallow trench isolation region; a semiconductor material comprising an epitaxially grown silicon germanium material in the source and in the drain wherein epitaxial growth occurs in areas defined by dummy structures; and a silicide contact contacting a portion of the source and drain regions.

In a further embodiment, the invention is directed to a semiconductor device comprising a gate structure, including a dummy gate over isolation regions; sidewall structures on sidewalls of the gates, including dummy sidewall structures on sidewalls of dummy gates; recesses in areas defined by sidewall structures; and an epitaxially grown semiconductor material filling the recesses.

DETAILED DESCRIPTION OF EXAMPLE EMBODIMENTS

Methods for fabricating semiconductor devices having strain engineering while minimizing defects associated with strained silicon devices, for example, faceting, in accordance with various example embodiments of the invention are described.

FIGS. 1 and 2A-2L illustrate further aspects relating to methods of fabricating semiconductor devices in accordance with the invention. The methods can be implemented in connection with the fabrication of integrated circuits including NMOS and/or PMOS transistors as illustrated herein, as well as to integrated circuits including other transistors and structures not illustrated.

Figure 1:
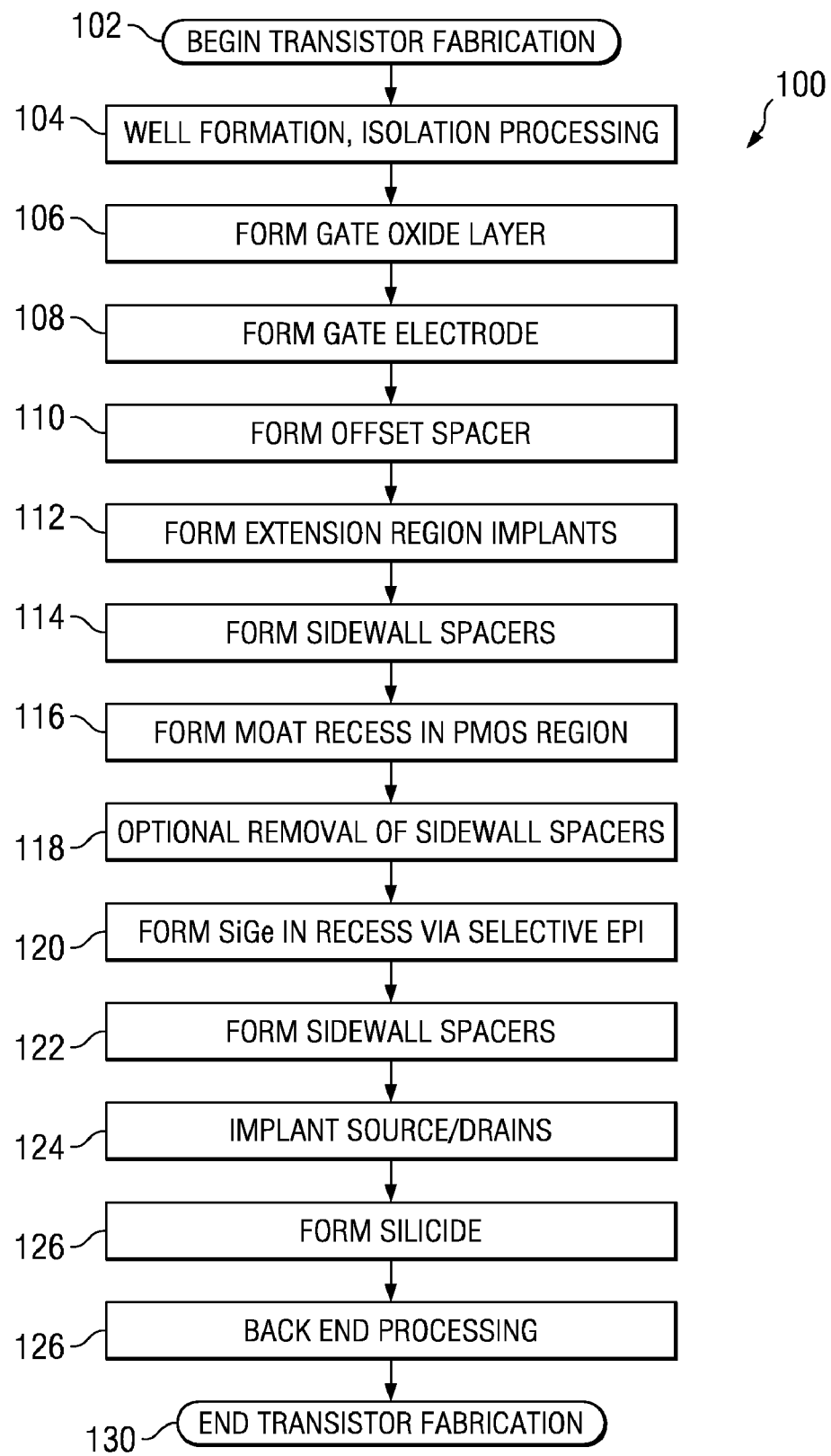
FIG. 1 is a flow chart illustrating a method of forming a semiconductor device according to one aspect of the invention.

FIG. 1 illustrates an example method 100 in accordance with the invention, and FIGS. 2A-2L illustrate the example semiconductor device at various stages of fabrication in accordance with the invention. While the example method 100 is illustrated and described below as a series of acts or events, it will be appreciated that the invention is not limited by the illustrated ordering of such acts or events. For example, some acts may occur in different orders and/or concurrently with other acts or events apart from those illustrated and/or described herein, in accordance with the invention. In addition, not all illustrated steps may be required to implement a methodology in accordance with the invention.

The method 100 begins at 102, wherein device fabrication is initiated and well formation and isolation processing is performed at 104. Act 104 thus defines NMOS and PMOS regions, wherein NMOS regions comprise a P-well in which n-type source/drain regions will later be formed, and PMOS regions comprise an N-well in which p-type source/drain regions will later be formed, respectively. In addition, isolation regions may comprise shallow trench isolation (STI) or field oxide (FOX) regions that serve to define various active areas and electrically isolate various active areas laterally from one another.

The method 100 continues at 106, wherein a gate oxide layer is formed in active areas defined by the various formed isolation regions. In one example, the gate oxide comprises a thin, thermally grown silicon dioxide layer; however, other type gate dielectrics (such as high-k dielectrics) may be formed and are contemplated by the invention. A conductive gate layer is then deposited over the gate oxide at 108 and patterned to form a conductive gate electrode. For example, a polysilicon layer may be deposited via chemical vapor deposition (CVD) and patterned via etching to form gate electrodes in both NMOS and PMOS regions, respectively, as well as disposable or dummy gates (hereafter "dummy" gates) over isolation regions.

An offset spacer is then formed on lateral edges of the conductive gate electrodes and dummy gate electrodes at 110. For example, a thin offset layer (e.g., an oxide or nitride layer) is formed generally conformally over the patterned gate and then etched using a generally anisotropic dry etch to remove offset layer material on top of the gate and in the source/drain regions, leaving a thin offset spacer material on lateral edges of the gate. The offset spacer, as will be further appreciated below, is employed in this example to space the strain inducing material slightly away from the channel region under the gate as, for example, by a distance of about 5 nm to about 30 nm.

Extension region implants can then be formed at 112 where p-type dopants are implanted in the PMOS region to form a p-type extension region, and n-type dopants are implanted in the NMOS region to form an n-type extension region.

Still referring to FIG. 1, sidewall spacers are then formed on the gate structures at 114, including dummy sidewall spacers on the dummy gate electrodes. The sidewall spacers comprise an insulating material such as an oxide, a nitride or a combination of such layers. The spacers are formed by depositing a layer of such spacer material(s) over the device in a generally conformal manner, followed by an anisotropic etch thereof, thereby removing such spacer material from the top of the gate structure and from the moat or active area and leaving a region on the lateral edges of the gate structure, overlying the offset spacers. The sidewall spacers are substantially thicker than the offset spacers, thereby resulting in the subsequently formed source/drain regions to be offset from lateral edges of the gate structure at least about 60 nm.

A recess is then formed in the moat area extending between the gate structure and the isolation regions at 116 in the PMOS region. The moat area refers to the active region of the silicon body where extension regions and subsequently source/drain regions may be formed. The recess is formed using, for example, a dry etching process such as the chemistry employed to etch STI trenches in the semiconductor body when forming isolation regions. Gate structure can be masked (not shown) so as to prevent formation of a recess in the top portion of the gate.

At 118, sidewall spacers may be removed. Where sidewall spacers were formed from an oxide, spacers are removed by known etching techniques. Spacers formed from a nitride insulating material may be left in place.

The method 100 then continues at 120, wherein silicon germanium (SiGe) is formed in the recesses in the PMOS region. In one example, the silicon germanium is formed via a selective epitaxial deposition process such as an LPCVD (low pressure chemical vapor deposition) process using dichlorosilane and germane as the source gases. While not intending to be limited to any one theory, it is believed that the silicon germanium within the recesses forms an alloy that has a lattice with the same structure as the silicon body lattice; however, the silicon germanium has a larger spacing. Consequently, it is believed that the silicon germanium within the recesses will tend to expand, thereby creating a compressive stress within the channel of the semiconductor body underneath the gate.

After filling recesses with semiconductor material (e.g., silicon germanium) source/drain sidewall spacers can be formed at 122. Source/drain sidewall spacers comprise an insulating material such as an oxide, a nitride, or a combination of layers of such materials. Sidewall spacers can be formed as described hereinabove. The source/drain regions are then formed by implantation at 124, wherein a source/drain dopant is introduced into the exposed areas (top of gate electrode and active areas not covered by sidewall spacers). The source/drain regions are then completed with a thermal process to activate the dopant.

The method 100 then concludes with silicide processing at 126, wherein a metal layer is formed over the device, followed by a thermal process wherein the metal and silicon interfaces react to form a silicide (on top of the gate and in the source/drain regions). Unreacted metal is then stripped away, and back end processing, such as formation of interlayer dielectric and metallization layers, is performed at 128 to conclude the device formation at 130.

Figure 2G:
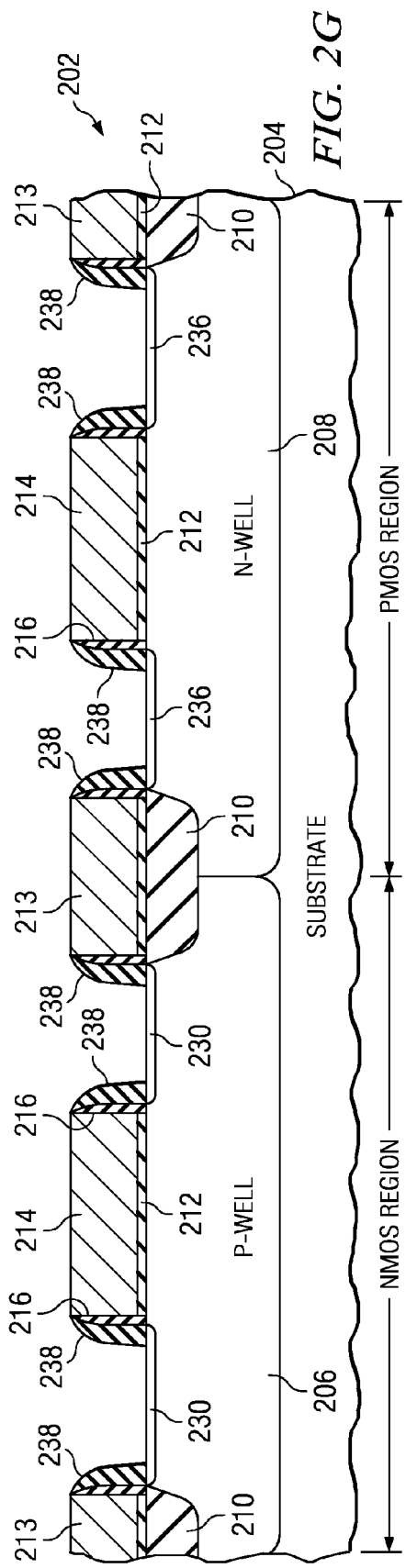
FIGS. 2A-2I and 2K-2I are fragmentary cross section diagrams illustrating various steps of forming NMOS and PMOS transistors in accordance with the invention of FIG. 1.

FIGS. 2A-2K illustrate steps in formation of a transistor device in accordance with the method of FIG. 1. In FIG. 2A, a transistor device 202 includes a semiconductor body 204, such as a substrate, having a number of wells formed therein, such as a P-well 206 to define an NMOS transistor device region and an N-well 208 to define a PMOS transistor device region, respectively. Further, isolation regions 210 such as field oxide (FOX) or shallow trench isolation (STI) regions are formed in the semiconductor body to define active area regions 211.

In FIG. 2B, the transistor device 202 is illustrated, wherein a gate dielectric 212 has been formed, for example, thermally grown $SiO_2$, over the active areas 211. However, other types of gate dielectrics (such as high-k dielectrics) can be formed and are contemplated by the various embodiments.

Referring to FIGS. 2C and 2D, a conductive gate electrode material, such as, for example, polysilicon, can be deposited and patterned by an etching process 215 to form a gate electrode 214 overlying the gate oxide 212. Concurrently, dummy gates 213 are formed overlying gate oxide 212 in STI regions 210. Offset spacer 216 can then be formed on the lateral edges of the gate electrode 214 and dummy gate electrode 213, as seen in FIG. 2D, wherein the offset spacers can have a width 216a of about 10-50 nm.

The PMOS region can then be masked off, as illustrated in FIG. 2E, with a masking material 226 such as photoresist, and an extension region implant 228 can be performed to form n-type extension region 230 in the NMOS region. According to various embodiments, a thermal process, such as a rapid thermal anneal, can then be performed to activate the dopant, wherein lateral diffusion of the extension regions 230 under the offset spacer 216 is achieved. Example temperatures for activating dopants are from about 650° C. to about 1050° C. In certain embodiments, the temperature can be about 950° C. and, in still further embodiments, the temperature can be about 1050° C. At these temperatures, there is amorphous layer regrowth.

The p-type extension region mask 226 can then be removed, and an n-type extension region mask 232 can be deposited and patterned to cover the NMOS region, as illustrated in FIG. 2F. A p-type extension region implant process 234 can then be performed to form p-type extension regions 236 in the PMOS region, as illustrated.

The mask 232 can then be removed and sidewall spacers 238 can then be formed adjacent offset spacers 216 on the lateral edges of the gate structures 214, including dummy sidewall spacers on dummy gates 213. For example, an insulating sidewall material can be deposited in a generally conformal manner over the device and subsequently subjected to an anisotropic etch to remove the insulating material on top of the gate and over the active areas, leaving sidewall spacers 238 in both the NMOS and PMOS regions, as illustrated in FIG. 2G. Example materials used for the dummy sidewall spacers 238 include various nitrides, such as silicon nitrides. However, other acceptable material can also be used. The dummy sidewall spacers have a width of about 10 nm to about 60 nm.

Figure 2H:
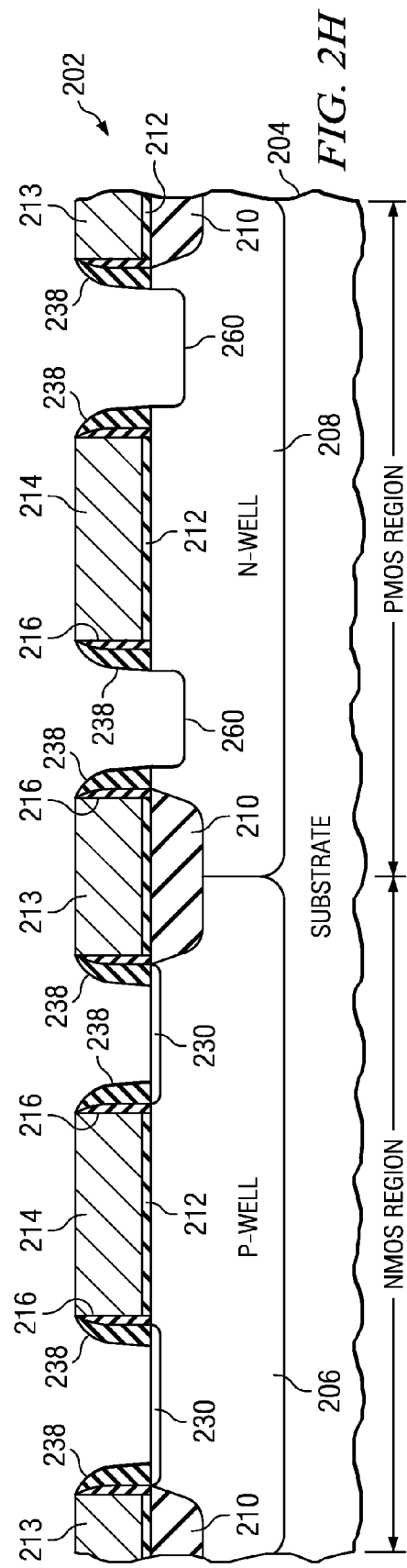

Recesses 260 can then be formed in the PMOS region in areas defined by sidewall spacers 238 and extending between the gate structure and the isolation regions, as shown in FIG. 2H, while the NMOS region is masked (not shown). The area where the recesses are formed can include the active regions of the silicon body where extension regions 230 and 236 and source and drain regions 268 and 270 (FIG. 2K) are formed. Recesses 260 can be formed using, for example, a dry etching technique such as the chemistry employed to etch the STI trenches in the semiconductor body when forming isolation regions. According to an embodiment, the recesses can extend into the semiconductor body to a depth of about 120 nm to about 130 nm. In certain embodiments, the gate structure is not masked during recess formation.

As shown in FIG. 2I, recesses 260 can then be filled with a semiconductor material 265 by a selective epitaxial deposition process 267, whereby a germanium containing gas source such as germane is added to a silane or dichlorosilane, such that a silicon germanium material 265 is formed in the recesses 260. The amount of germanium in the silicon germanium material will be from about 20 at. wt. % to about 40 at. wt. %.

Figure 2J:
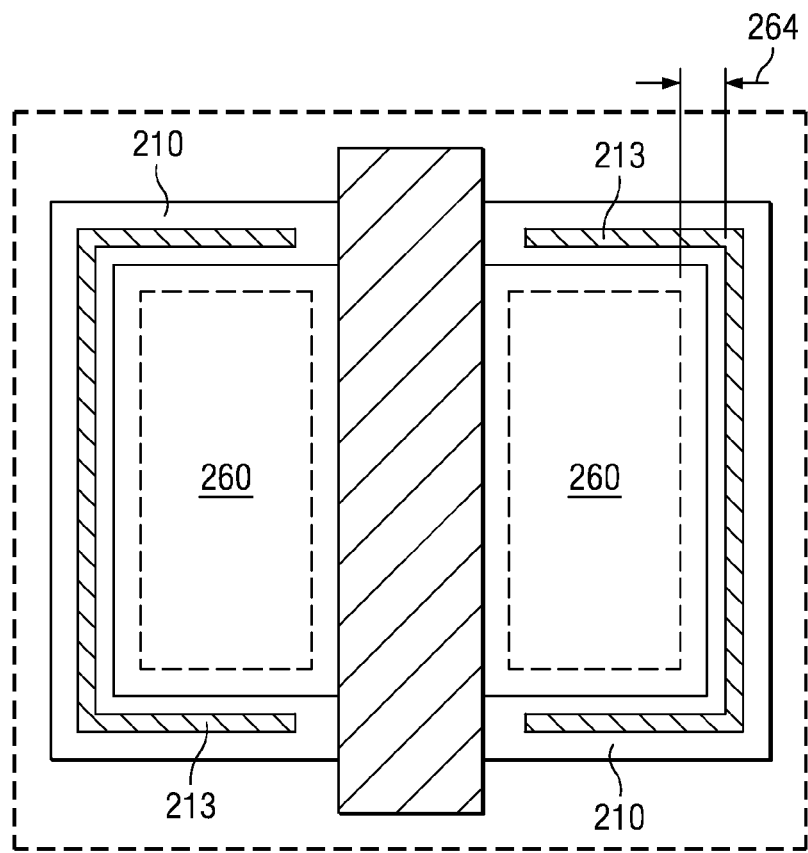
FIG. 2J is a top plan view of a semiconductor device illustrating an arrangement around a source/drain region in accordance with the invention.
Figure 5:
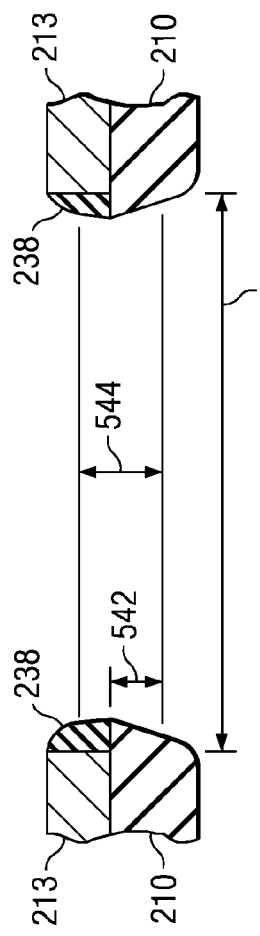
FIG. 5 is a cross section along the width of a source/drain region in accordance with an embodiment of the invention.
Figure 6:
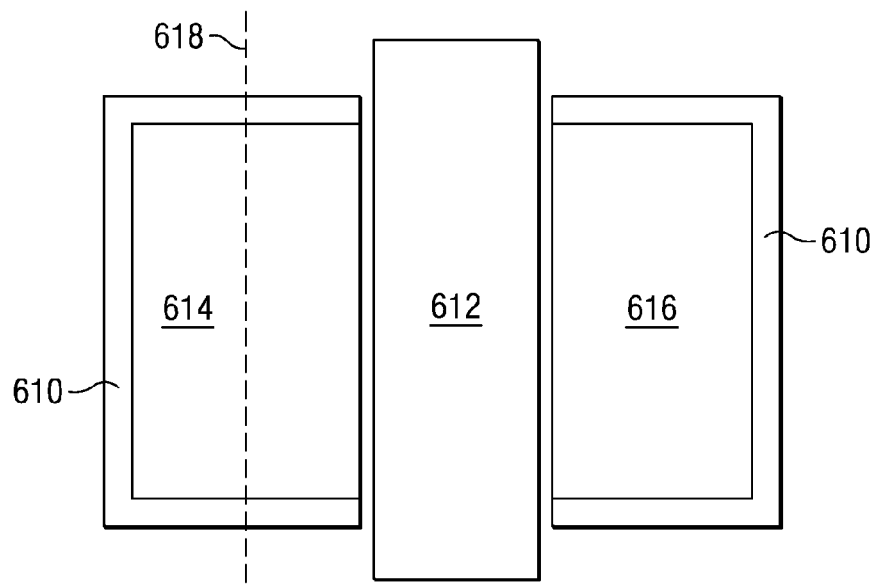
FIG. 6 is a top plan view of a semiconductor device illustrating an arrangement around a source/drain region.
Figure 7A:
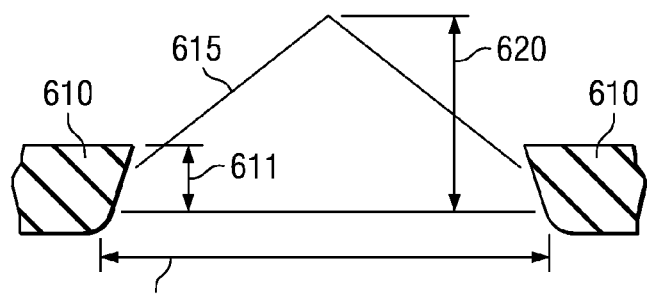
FIGS. 7A-7B are cross sections along the width of the source/drain region of FIG. 6 illustrating a narrow width and a wide width device formed in accordance with conventional methods.
Figure 7B:
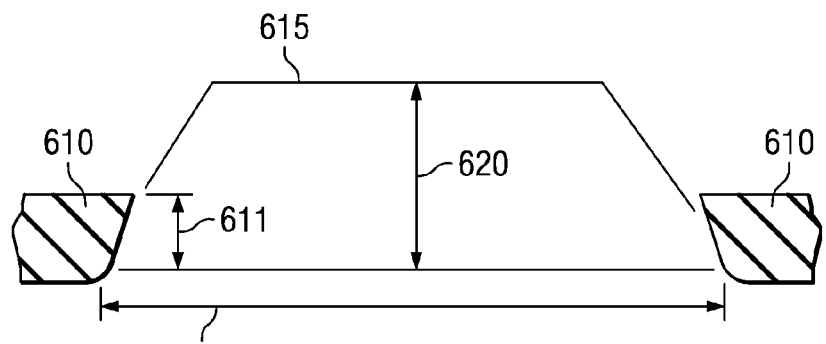

Turning to FIG. 6, there is illustrated a top plan view of a source 614/drain 616 having a gate electrode 612 and isolation regions 610, in which FIGS. 7A and 7B illustrate narrow width 613 and wide width 617 devices, respectively, taken along section line 618 (FIG. 6). In conventional methods of forming silicon-germanium layers, epitaxial silicon-germanium growth 620 from recesses, having depth 611, between isolation regions 610 resulted in faceting 615 of the silicon germanium. As illustrated in FIG. 2J, which is a top plan view showing the middle of a source/drain region, and FIG. 5, which is a cross section along a section line taken across the width 540 of the source/drain region (similar to the view taken along the section line 618 shown in FIG. 6), addition of the dummy gate 213 and dummy sidewall spacers 238 of the invention results in spacing 264 of the recesses 260, having a depth 542, from the STI structures 210, thus allowing for growth of the silicon germanium material 265 vertically 544 along the dummy sidewalls 238 and preventing faceting of the silicon germanium along the STI interface. Alternatively, where the STI is an oxide structure, the silicon germanium material 265 will grow from deep within the structure such that near the surface of the STI, the material will be at a lower height. In such a case, the dummy sidewall spacers 238 provide support for the growing silicon germanium front as it grows above the silicon surface, and spacing of the recesses 260 from the STI structures 210 is not necessary.

As shown in FIG. 2K, after filling the recesses with semiconductor material 265, sidewall spacers 238 can be removed and additional sidewall spacers 266 can be formed thereafter. Source and drain regions 268 and 270 can then be formed in the NMOS and PMOS regions respectively, as shown in FIG. 2K. As discussed above in conjunction with the extension region implants, the source/drain implants can be performed with an n-source/drain mask (not shown) and a p-source/drain mask (not shown) in order to implant the NMOS region and the PMOS region separately with n-type and p-type dopant, respectively.

Figure 2L:
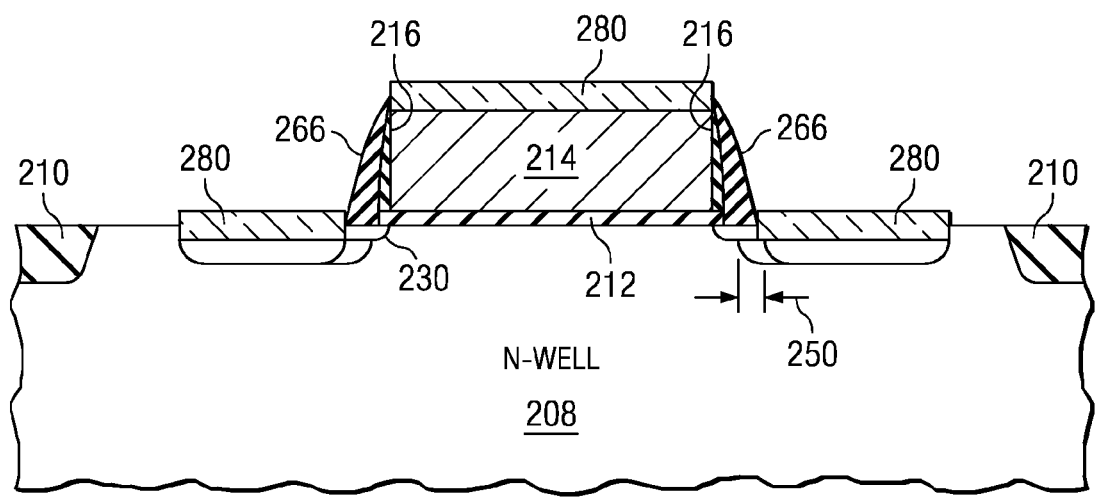

According to various embodiments, as shown for example in FIG. 2L which is an enlarged view of a resulting PMOS transistor fabricated in accordance with the invention, a silicide 280 can then be formed. For example, a metal layer can be deposited, such as by sputtering, followed by a thermal process. During the thermal process, those regions where the metal contacts silicon react to form a metal silicide. More particularly, the silicide can then form on the source/drain regions and on top of the gates. Unreacted metal is then stripped away, and back end processing, such as formation of interlayer dielectric and metallization layers, can be performed so as to conclude the device formation.

Figure 3:
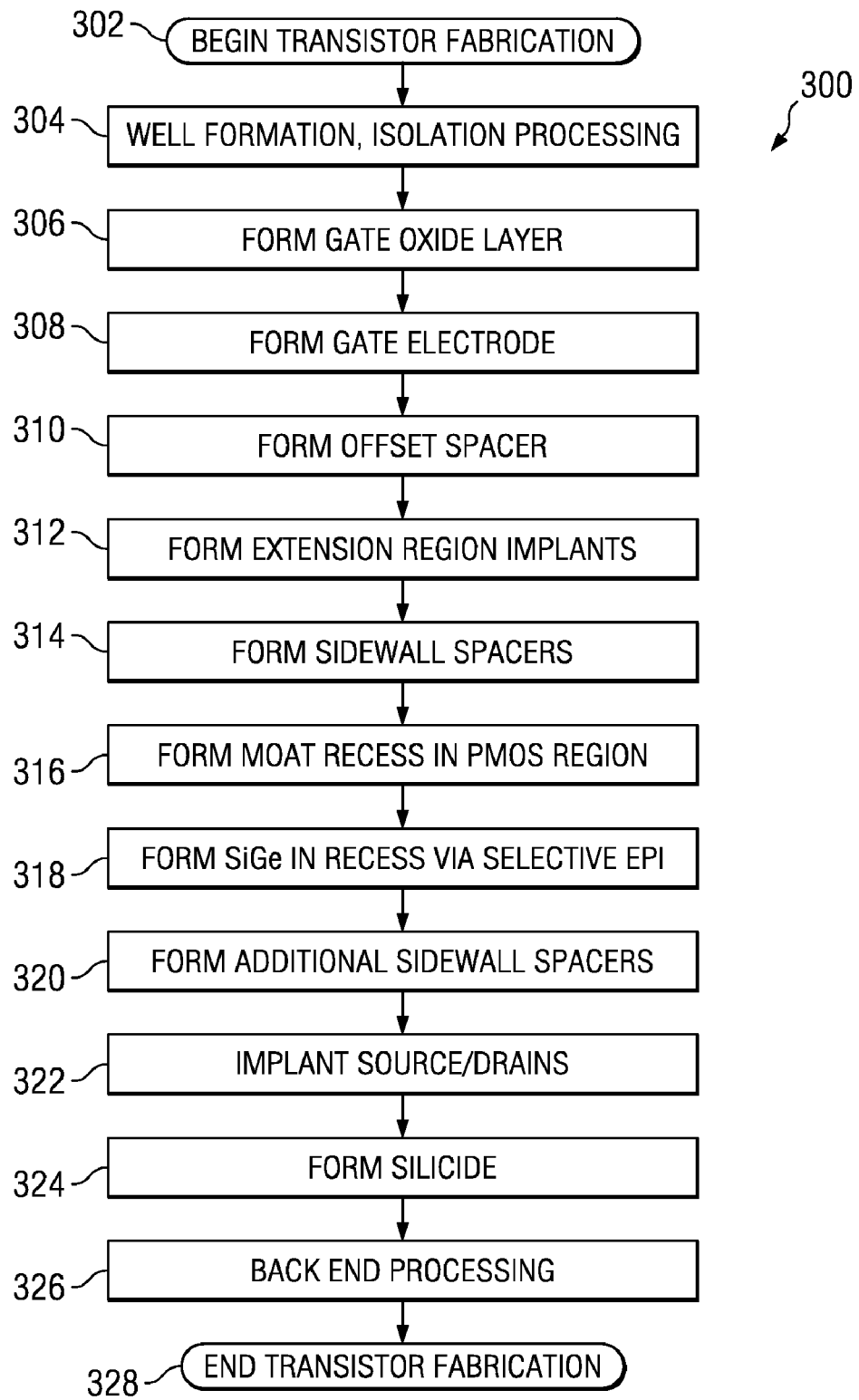
FIG. 3 is a flow chart illustrating a method of forming a semiconductor device according to an alternative aspect of the invention.
Figure 4:
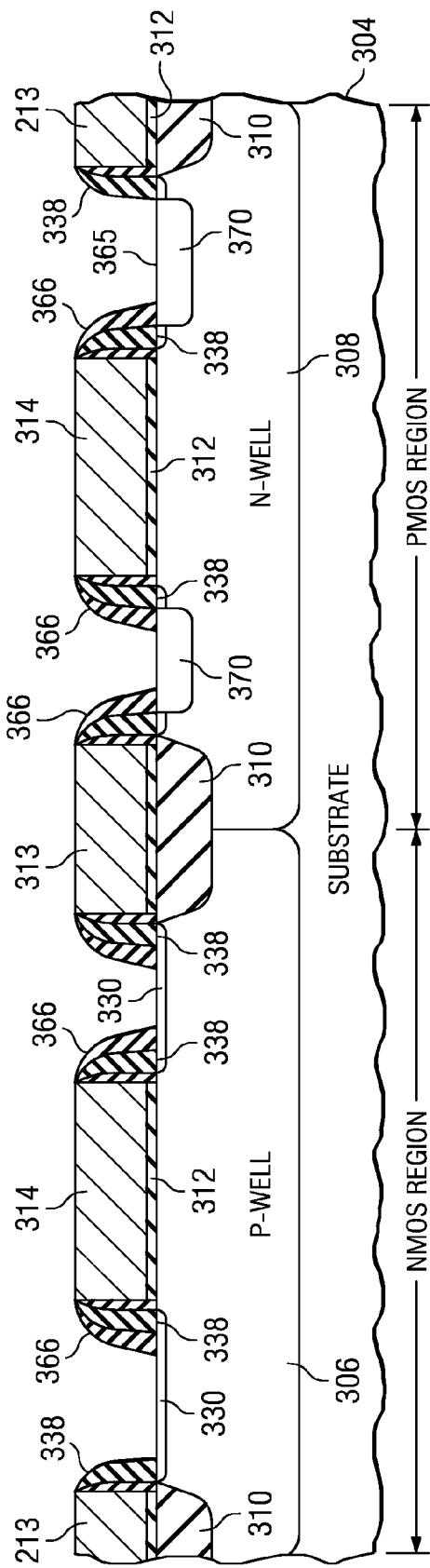
FIG. 4 is a fragmentary cross section diagram illustrating a step of forming NMOS and PMOS transistors in accordance with the method of FIG. 3.

FIGS. 3 and 4 illustrate an alternative embodiment of method 300 in accordance with the invention, in which semiconductor processing proceeds as in method 200, except that sidewall spacers 338 remain and a second set of sidewall spacers 366 is formed following the filling of recesses with semiconductor material, as illustrated in FIG. 4.

Although the invention is described above with respect to the use of germanium to form a silicon germanium lattice structure, the invention contemplates the use of any element that will create an alloy with silicon and serve to impart a compressive stress to the channel of the PMOS devices, and such alternatives are contemplated as falling within the scope of the invention. Moreover, while the invention has been illustrated and described with respect to one or more example implementations, those skilled in the art to which the invention relates will appreciate that alterations and/or modifications may be made to those examples without departing from the spirit and scope of the claimed invention.

What is claimed is:

1. A method of forming a semiconductor device, comprising:
   forming isolation regions to isolate an active area of a MOS transistor region of a substrate;
   forming a gate oxide layer over the active area and over the isolation regions;

forming and patterning a gate material layer over the gate oxide layer, to form a gate electrode over the active area and dummy gate electrodes over the isolation regions;

forming spacers on sides of the gate electrode and dummy spacers on sides of the dummy gate electrodes;

forming recesses in moat areas of the active area extending between the gate electrode and the isolation regions; and forming silicon germanium by selective epitaxial deposition within the recesses and up to the dummy spacers.

2. The method of claim 1, wherein the substrate is a silicon substrate.

3. The method of claim 1, wherein the recesses extend into the substrate to a depth of about 120 nm to about 130 nm.

4. The method of claim 3, wherein the dummy spacers are formed to a width of about 10 nm to about 60 nm.

5. The method of claim 1, wherein the dummy spacers comprise silicon nitride; and forming the silicon germanium grows the silicon germanium vertically along the silicon nitride.

6. The method of claim 1, wherein the amount of germanium present in the silicon germanium is from about 20 at. wt. % to about 40 at. wt. %.

7. The method of claim 1, wherein the deposited silicon germanium forms a strained region.

8. The method of claim 1, wherein the substrate is a silicon substrate; the isolation regions are shallow trench isolation regions comprising oxide material; the dummy spacers comprise silicon nitride; and forming the silicon germanium grows silicon germanium vertically along the silicon nitride.

9. The method of claim 8, wherein the gate oxide layer is a thermally grown layer of silicon dioxide; and the gate material layer is a layer of polysilicon.

10. The method of claim 1, further comprising forming elevated source/drain regions by dopant implantation following forming the silicon germanium.

11. A method of forming a semiconductor device, comprising:

forming oxide isolation regions to isolate active areas of NMOS and PMOS transistor regions of a substrate;

forming a gate oxide layer over the active areas and over the oxide isolation regions;

forming and patterning a gate material layer over the gate oxide layer, to form gate electrodes over the active areas and dummy gate electrodes over the isolation regions;

forming spacers on sides of the gate electrodes and dummy spacers on sides of the dummy gate electrodes;

forming recesses in moat areas of the active area of the PMOS transistor region extending between the gate electrode formed over the active area of the PMOS transistor region and the oxide isolation regions that isolate the active area of the PMOS transistor region; and forming silicon germanium by selective epitaxial deposition within the recesses and up to the dummy spacers on sides of the dummy gate electrodes facing the active area of the PMOS transistor region.

12. The method of claim 11, wherein the substrate is a silicon substrate; the dummy spacers on sides of the dummy gate electrodes facing the active area of the PMOS transistor region comprise silicon nitride; and forming the silicon germanium grows silicon germanium vertically along the silicon nitride.

13. A semiconductor device, comprising:

isolation regions isolating an active area of a MOS transistor region of a substrate;

a gate oxide layer formed over the active area and over the isolation regions;

a gate material layer formed and patterned over the gate oxide layer to provide a gate electrode over the active area and dummy gate electrodes over the isolation regions;

spacers formed on sides of the gate electrode and dummy spacers formed on sides of the dummy gate electrodes;

recesses formed in moat areas of the active area extending between the gate electrode and the isolation regions; and source/drain regions comprising silicon germanium formed by selective epitaxial deposition within the recesses and up to the dummy spacers, and implanted with dopant to form source/drains.

14. The semiconductor device of claim 13, wherein the recesses extend into substrate to a depth of about 120 nm to about 130 nm.

15. The semiconductor device of claim 14 wherein the dummy spacers have a width of about 10 nm to about 60 nm.

16. The semiconductor device of claim 13, wherein the dummy spacers comprises silicon nitride.

17. The semiconductor device of claim 13, wherein the amount of germanium present in the silicon germanium is from about 20 at. wt. % to about 40 at. wt. %.

18. The method of claim 13, wherein the substrate is a silicon substrate; the isolation regions are shallow trench isolation regions comprising oxide material; the dummy spacers comprise silicon nitride; and the silicon germanium includes silicon germanium grown vertically along the silicon nitride.

19. The method of claim 18, wherein the gate oxide layer is a thermally grown layer of silicon dioxide; and the gate material layer is a layer of polysilicon.

* * * * *